United States Patent
Hirai et al.

Patent Number: 5,296,719
Date of Patent: Mar. 22, 1994

[54] QUANTUM DEVICE AND FABRICATION METHOD THEREOF

[75] Inventors: Yoshihiko Hirai; Juro Yasui; Yasuaki Terui; Kiyoshi Morimoto; Atsuo Wada; Kenji Okada; Shin Hashimoto; Shinji Odanaka; Masaaki Niwa; Kaoru Inoue, all of Osaka, Japan

[73] Assignee: Matsushita Electric Industrial Co., Ltd., Osaka, Japan

[21] Appl. No.: 915,311

[22] Filed: Jul. 20, 1992

[30] Foreign Application Priority Data

| Jul. 22, 1991 | [JP] | Japan | 3-180830 |
| Jul. 22, 1991 | [JP] | Japan | 3-180831 |
| Jul. 22, 1991 | [JP] | Japan | 3-180832 |
| Jul. 22, 1991 | [JP] | Japan | 3-180834 |

[51] Int. Cl.$^5$ .................. H01L 21/308; H01L 27/08
[52] U.S. Cl. ..................... 257/14; 257/622; 437/172; 437/228; 437/238; 437/241; 156/647; 156/662
[58] Field of Search ............. 156/647, 662; 437/228, 437/235, 238, 241, 172; 257/14, 622

[56] References Cited

U.S. PATENT DOCUMENTS

| 3,864,818 | 2/1975 | Kooi et al. ............... 437/3 |
| 4,611,384 | 9/1986 | Bencuya et al. .......... 29/571 |
| 4,692,780 | 9/1987 | Bencuya et al. .......... 357/22 |
| 4,814,839 | 3/1989 | Nishizawa et al. ....... 357/23.3 |
| 5,066,603 | 11/1991 | Bulat et al. .............. 437/29 |
| 5,070,510 | 12/1991 | Konushi et al. .......... 372/46 |

FOREIGN PATENT DOCUMENTS

| 0386388 | 9/1990 | European Pat. Off. ...... 156/647 |
| 55-120168 | 9/1980 | Japan ....................... 257/622 |
| 61-59839 | 3/1986 | Japan ....................... 156/647 |
| 62-89383 | 4/1987 | Japan . |
| 62-108592 | 5/1987 | Japan . |
| 2-2198 | 1/1990 | Japan . |
| 2-28387 | 1/1990 | Japan . |
| 2-163928 | 6/1990 | Japan . |

OTHER PUBLICATIONS

Ismail et al., "Patterning and characterization of large-area quantum wire arrays", Appl. Phys. Lett. 58(14), Apr. 8, 1991, pp. 1539-1541.

Primary Examiner—Olik Chaudhuri
Assistant Examiner—Ourmazd S. Ojan
Attorney, Agent, or Firm—Willian Brinks Olds Hofer Gilson & Lione

[57] ABSTRACT

A quantum wire is formed at the top of triangular protrusion of silicon substrate. A quantum wire is isolated from the substrate by silicon oxide layers. A quantum wire is isolated from the substrate by impurity layers of a conduction type different from that of the substrate. An insulator film and a gate electrode are formed at the edge of triangular protrusion of a silicon substrate, and a quantum wire is induced by applying a voltage to the gate electrode. A quantum wire structure is fabricated by forming saw-tooth-like protrusions having (111) side planes by performing anisotropic crystalline etching and by oxidizing the silicon substrate with use of the oxide protection film to remain only around the top of the protrusions unoxidized. In another method, an oxide film is formed except around the top of the protrusions whereby a quantum wire is formed at the unoxidized region. In a different method, impurity layers are formed except around the top of the protrusions by ion implantation.

9 Claims, 9 Drawing Sheets

QUANTUM DEVICE AND FABRICATION METHOD THEREOF

BACKGROUND OF THE INVENTION

1. Field of the Invention

The present invention relates to a quantum device and a fabrication method thereof.

2. Description of the Prior Art

Recently, various element structures and manufacturing methods thereof have been developed in order to decrease the size of semiconductor devices. The decrease in the size of an element of a semiconductor device not only improves the degree of integration, but also generates various advantages and disadvantages of the operating characteristics of the elements.

One of the factors which controls the operating characteristics of an element is the structure of a wire through which carriers propagate. New devices have been developed to make use of quantum effects or the like of a quantum wire which makes the dimension of the electrical conduction low. For example, the increase in electronic mobility is reported by Sakaki (Jap. J. Appl. Phys. Vol. 19, No. 12. 1980, pp. L735–L738.).

In order to utilize a quantum effect, besides the requirement very small size wire which restricts the conduction of carriers to a low dimension, it is also required that the scatterings of the carriers have suppressed in order to conserve the wave property of carriers. Then, the lattice vibrations have to be suppressed by lowering the operating temperature of the element and the ionic scatterings have to be suppressed by using an intrinsic layer as a very narrow line. Further, the scatterings at the surface roughness have to be suppressed.

However, the state of the art lithography technique which makes use of an ultraviolet ray or the like has a limit of 0.5–0.25 μm practically as to the processing. Further, the prior art fine processing technique utilizing dry etching cannot suppress the scatterings due to surface roughness caused by the unevenness at the surface or at the interface due to damages.

An attempt was made to manufacture a good and flat fine wire by means including not only lithography, but also crystalline anisotropy etching. For example, FIGS. 1 and 2 show quantum wires manufactured by Shimizu (Jap. J. Appl. Phys. 27, L1778–L1779 (1988)) and by Iwameji (37th Meeting of Applied Physics Association, 30a-SB-5). In FIG. 1, a silicon wire 101 having (111) side planes are formed below a protection film 102, while in FIG. 2, a silicon wire 111 having (111) silicon side planes are formed below an etching protection film 112 on a SiO$_2$ layer 113 placed on a silicon substrate 114. These structures exceed the limit of lithography because they use crystalline anisotropy etching at silicon (111) planes and have superior flatness and linearity.

However, in the structures of the above-mentioned fine wires, the width of fine wire is limited by the length of the flat region at the top of trapezoid-like protrusions. That is, it is a problem that the structure of fine wire and the limit of the fine processing have restrictions.

SUMMARY OF THE INVENTION

An object of the present invention is to provide a quantum device having a fine wire of a new type of structure and a fabrication method thereof.

A first quantum wire structure according to the present invention comprises: a silicon substrate having a triangular protrusion; a silicon oxide layer formed on the sides of the triangular protrusion; and a silicon fine line formed above the top of the triangular protrusion in contact with the silicon oxide layers.

A second quantum wire structure according to the present invention comprises: a silicon substrate of a conduction type, having a triangular protrusion; an impurity layer formed on the sides of the triangular protrusion, having the other conduction type different from the conduction type of the silicon substrate; and a silicon fine line formed above the top of the triangular protrusion in contact with the silicon oxide layers.

A third quantum wire structure according to the present invention comprises a silicon substrate of a conduction type, having a triangular protrusion; an insulator layer formed on the triangular protrusion; and a gate electrode layer formed on the top of the triangular insulator layer; whereby an electric voltage is applied to the gate electrode to form a fine conduction line at the top of the triangular protrusion.

In a first method of fabricating a quantum wire structure according to the present invention, an etching protection film is formed on a silicon substrate having (100) surface, and a pattern is formed as a mask in the etching protection film. Then, saw-tooth-like protrusions having (111) side planes are formed by crystalline anisotropy etching with use of the mask of the etching protection film. Then, the etching protection film is removed, and an oxidization protection film is formed around the top of the protrusions. Next, the silicon substrate is oxidized. The use of the oxide protection film. prevents only the top portion of the protrusions from being oxidized. Thus, a quantum wire is formed at the unoxidized region.

In a second method of fabricating a quantum wire structure, after the saw-tooth-like protrusions having (111) side planes are formed, an ion implantation protection film is formed around the top of the protrusions. Then, oxygen ions are implanted in the substrate except below the ion implantation protection film, and heat treatment is performed whereby only the top portion of the protrusions unoxidized. Thus, a quantum wire is formed at the unoxidized region.

In a third method of fabricating a quantum wire structure, after the saw-tooth-like protrusions having (111) side planes are formed, an ion implantation protection film is formed around the top of the protrusions. Then, impurity ions are implanted into the silicon substrate with use of the ion implantation protection film. Thus, a quantum wire is formed at a region maintained as pure silicon.

In a fourth method of fabricating a quantum wire structure, after impurity ions are implanted into a silicon substrate to form a shallow impurity layer, the saw-tooth-like protrusions having (111) side planes are formed. Thus, a quantum wire is formed at a region maintained as impurity layers of silicon.

In a fifth method of fabricating a quantum wire structure, after saw-tooth-like protrusions having (111) side planes are formed, an insulator film is formed on the surface of the substrate. Then, a silica glass is embedded on the surface of the substrate except in an edge portion of the saw-tooth-like protrusions, and a gate electrode film is formed on the edge portion. Thus, a quantum wire is formed when a voltage is applied to the gate electrode film.

In a sixth method of fabricating a quantum wire structure, saw-tooth-like protrusions having (111) side planes are formed, an insulator film, a conductive polycrystalline silicon film and a metallic film are layered successively on the surface of the semiconductor substrate. Then, a resist is embedded on the surface of the substrate except in an edge portion of the saw-tooth-like protrusions. Next, the metallic film exposed at the edge portion and the resist are removed, and a metal silicide film is formed by heat treatment. Then, the metallic silicide film is removed selectively such that the conductive polycrystalline silicon film forms a gate electrode. Thus, a quantum wire is formed when a voltage is applied to the gate electrode film.

An advantage of the present invention is to provide a quantum wire having a width smaller than the limit of photolithography.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
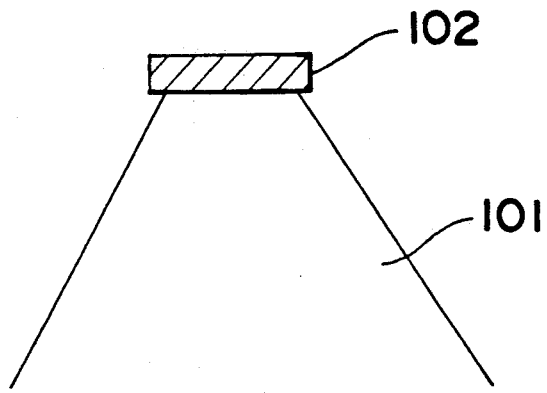
FIG. 1 is a schematic view of a prior art quantum wire structure.
Figure 2:
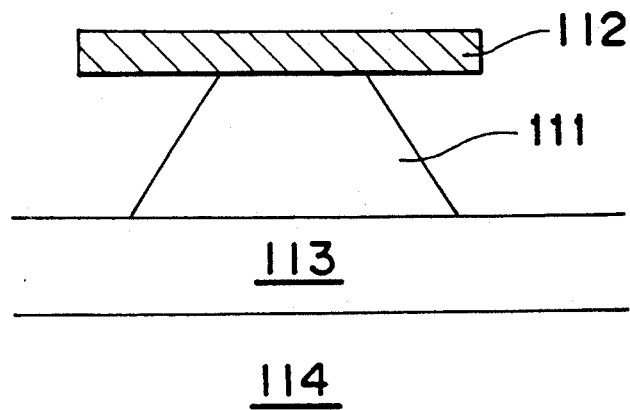
FIG. 2 is another schematic view of a prior art quantum wire structure.
Figure 3:
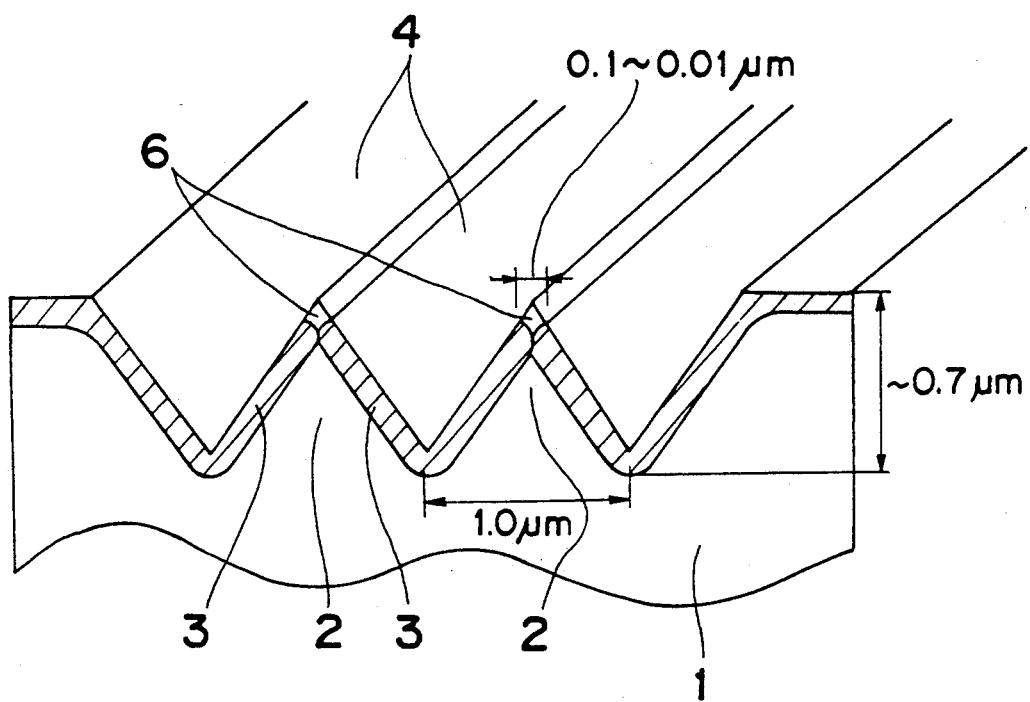
FIG. 3 is a perspective schematic view of a quantum wire of a first embodiment of the present invention.

Referring now to the drawings, wherein like reference characters designate like or corresponding parts throughout the views, FIG. 3 shows a schematic perspective view of a quantum wire, wherein the reference numeral 1 denotes a silicon substrate, the reference numeral 2 denotes a triangular protrusion of silicon, the reference numeral 3 denotes an oxide film layer, and the reference numeral 4 denotes a side wall of (111) plane of silicon, and the reference numeral 6 denotes a quantum wire. The distance between the protrusions 2 is determined according to the processing limit of lithography, and it is about 0.5-0.25 $\mu$m. The depth from the top of the protrusion 2 to the bottom of the groove between the protrusions is about 70% of the distance. The quantum wire 6 formed at the top of the protrusion 2 is separated by the oxide film layers 3 from the silicon substrate 1 from viewpoints of material and structure. The width of the quantum wire is 0.1-0.01 $\mu$m. Further, the side wall 4 of the fine line has very flat planes (111) which has an unevenness of a few nm or less. The oxide film layer 3 is made from silicon oxide prepared by the thermal oxidation of the silicon substrate 1. The quantum wire 6 and the semiconductor substrate 1 are separated electrically from each other.

The quantum wire 6 is very fine and exceeds the processing limit of lithography, and carriers are confined as to the aspects of the material and the structure.

One of the methods of fabricating this type of quantum wire is explained below in a fourth embodiment.

Figure 4:
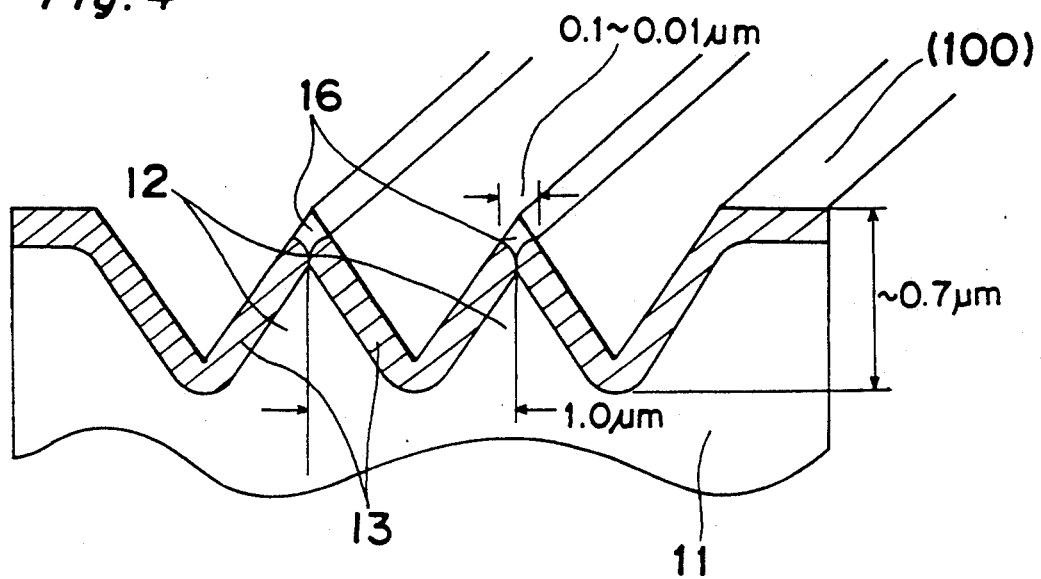
FIG. 4 is a perspective schematic view of a quantum wire of a second embodiment of the present invention.

Next, a second embodiment of the present invention is explained with reference to FIG. 4. The reference numeral 11 denotes a silicon substrate of a conduction type, the reference numeral 12 denotes a triangular protrusion of silicon, the reference numeral 13 denotes an impurity layer of the other conduction type from that of the substrate 11. This quantum wire is different from that shown in FIG. 3 in that the impurity layers 13 are provided by introducing impurities to the side planes of the protrusions 12 instead of the oxide film layers 3. The quantum wire 16 is formed at the top of the protrusion 12, separated by the impurity layers 13 from the silicon substrate 11 from viewpoints of material and structure. The width of the quantum wire 16 is 0.1-0.01 $\mu$m. The quantum wire 16 and the semiconductor substrate 11 are separated electrically from each other. The impurity layer 13 is a P type layer if the silicon substrate 11 is N type, while it is an N type layer if the silicon substrate 11 is P type. Thus, carriers in the quantum wire 16 are confined by the potential barrier, and the quantum wire 16 is separated electrically from the silicon substrate 11. Thus, a quantum wire 16 having flat side wall planes of (111) planes can be obtained.

One of the methods of fabricating this type of quantum wire is explained below in a fifth embodiment.

Figure 5:
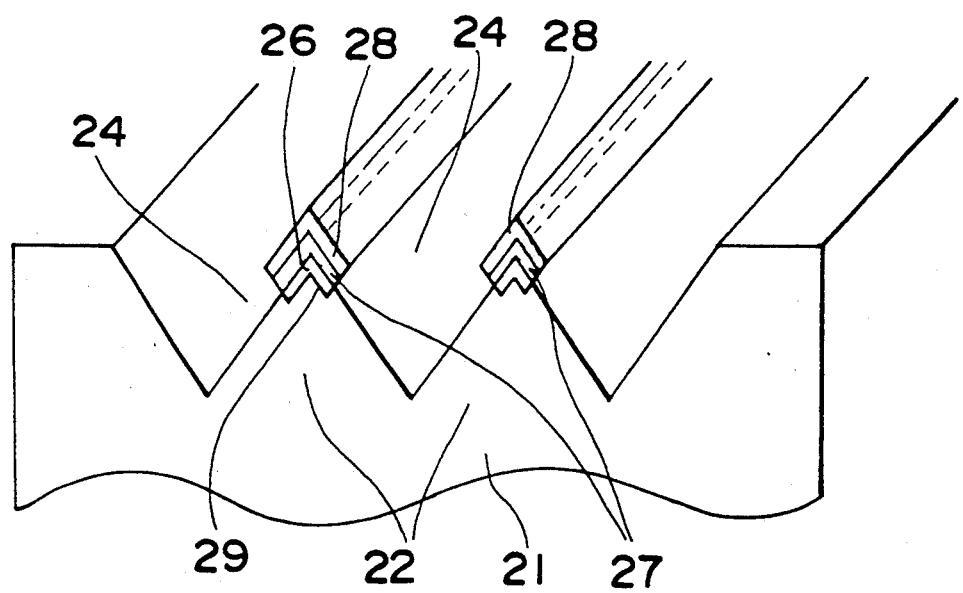
FIG. 5 is a perspective schematic view of a quantum wire of a third embodiment of the present invention.

Next, a third embodiment of the present invention is explained with reference to FIG. 5. The reference numeral 21 denotes a silicon substrate, the reference numeral 22 denotes a triangular protrusion of silicon, the reference numeral 24 denotes a side wall of (111) plane of silicon and the reference numeral 26 denotes a quantum wire. An insulator film 27 is formed around the edge of the protrusions 22, and a gate electrode 28 is formed on the insulator film 27. This quantum wire 26 is different from the quantum wire of FIG. 3 in that the insulator film 27 is provided on the surface of the quantum wire 26, and the gate electrode 28 is provided on the insulator film 27. By applying a bias voltage to the gate electrode 28 against the silicon substrate 21, an inversion region 29 is generated in the quantum wire 26. Then, the carriers are confined in the inversion region 29 and the quantum wire 26 is isolated electrically from the silicon substrate 21. Thus, one-dimensional conduction wires having a flat side wall planes are formed at the top of the protrusions 22.

One of the methods of fabricating this type of quantum wire is explained below in a ninth embodiment.

Figure 6A:
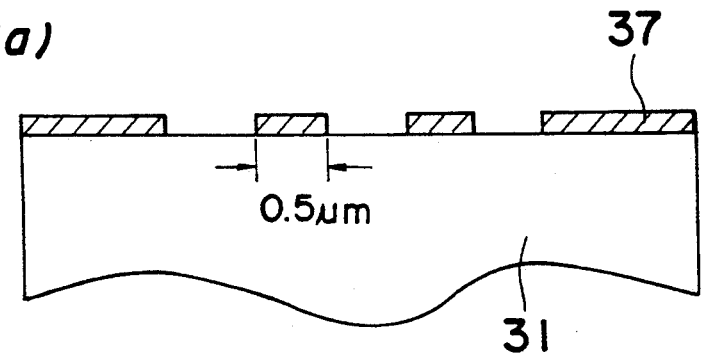
FIGS. 6(a)-(f) are schematic sectional views of a semiconductor substrate for illustrating a method of forming a quantum wire of a fourth embodiment of the present invention.

Next, a fabrication method of a fourth embodiment of the present invention is explained with reference to FIGS. 6(a)-(f). First, a silicon oxide film 37 of about 0.1 $\mu$m thickness is formed on the silicon substrate 31 having a (100) plane at the surface by a thermal oxidation process. Then, patterns of about 0.5 μm width are formed as etching protection films 37 by photolithography and dry etching, as shown in FIG. 6(a).

Figure 6B:
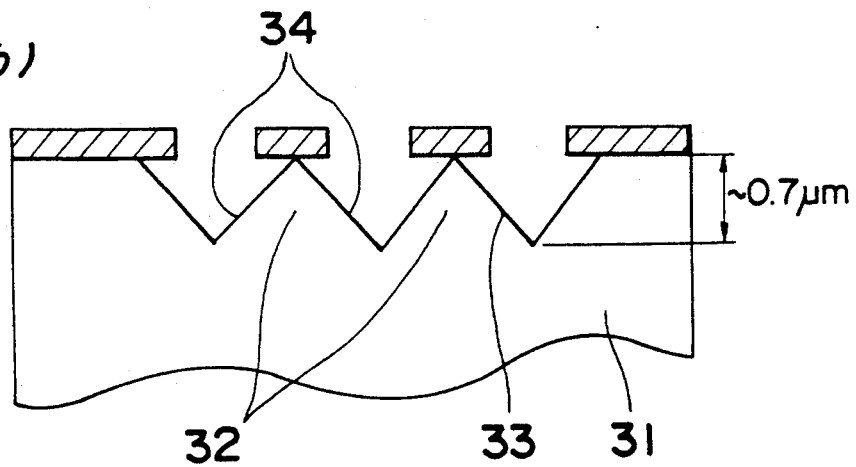

Next, the crystalline anisotropy etching of silicon is performed. Sodium hydroxide aqueous solution, hydrazine, ethylene diamine-pyrocatechol-water (EPW) or the like is used as an etchant. The etching rate of (111) plane of these etchants is very small, and the (100) plane becomes the rate-determining plane. Therefore, the etching of (100) plane proceeds first by using the etching protection films 37 as a mask, and V-type grooves having side planes 33 of (111) are formed finally by adjusting the etching time. Thus, protrusions 32 having triangular sections and (111) side planes 34 are formed below the etching protection films 37, as shown in FIG. 6(b).

Figure 6C:
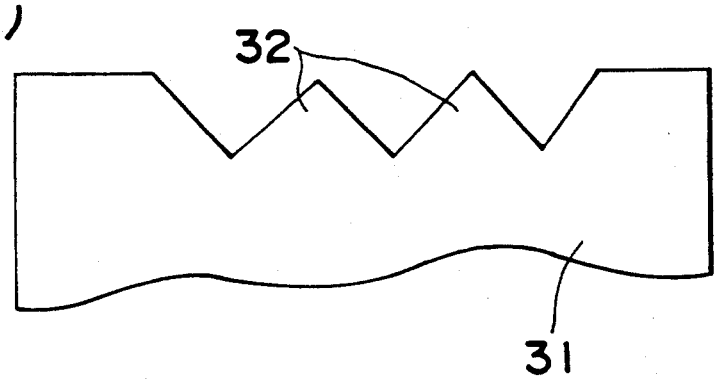

Then, the etching protection films 37 are removed with use of, for example, hydrofluoric acid, to expose the protrusions 32 having triangular sections, as shown in FIG. 6(c).

Figure 6D:
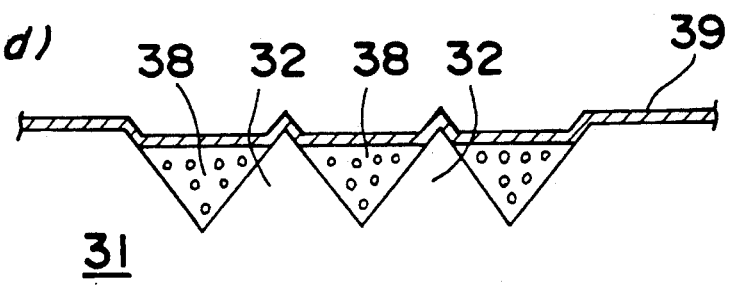

Next, as shown in FIG. 6(d), a resist 38 is embedded in the V-type grooves such that only the tops of the protrusions 32 are exposed. Then, a silicon nitride film 39 is deposited on the whole surface including the tops of the protrusions 32.

Figure 6E:
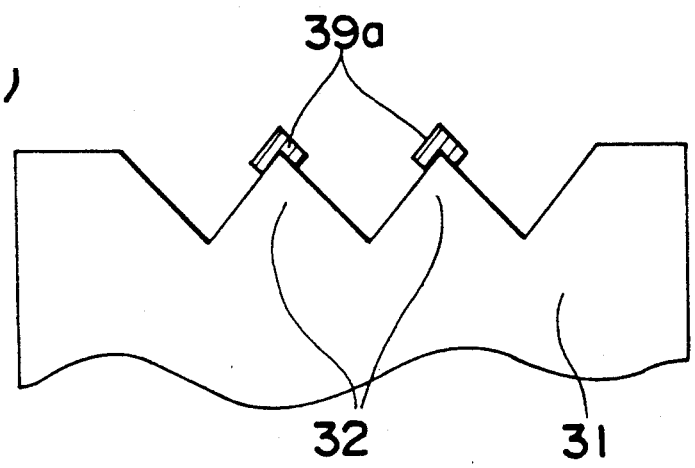

Next, the resist 38 is lifted off, and as shown in FIG. 6(e), oxidation protection films 39a of silicon nitride are left only at the tops of the protrusions 32.

Figure 6F:
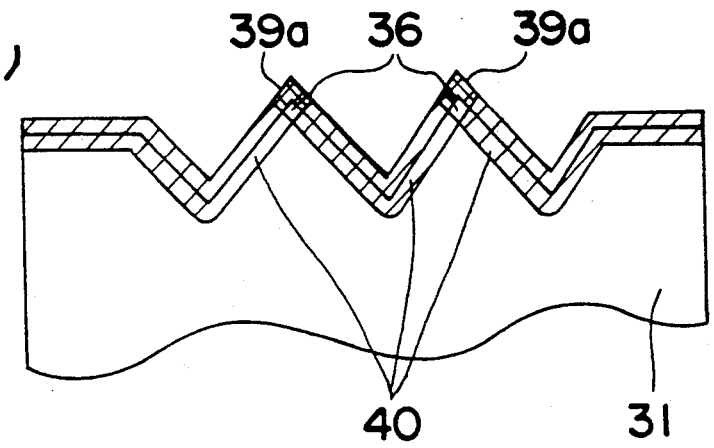

Then, by using the oxidation protection films 39a as a mask, the silicon substrate 31 is oxidized to form an oxide film 40 at the surface of the silicon substrate 31 except below the oxidation protection films 39a, as shown in FIG. 6(f). As a result a quantum wire 36 isolated from the silicon substrate 31 is formed between the oxide films 40 and below the protection film 39a.

Figure 7A:
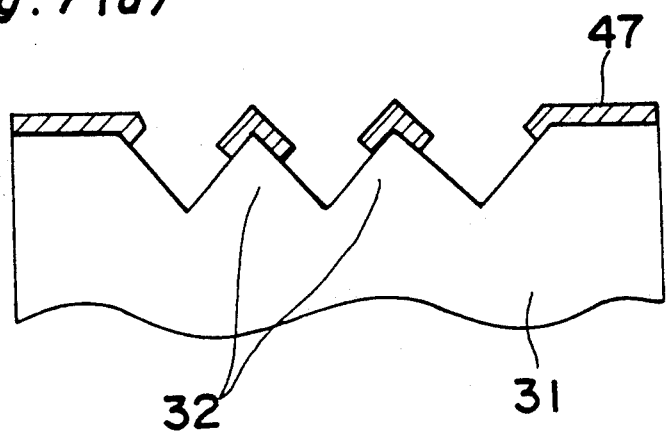
FIGS. 7(a) and (b) are schematic sectional views of a semiconductor substrate for illustrating a method of forming a quantum wire of a fifth embodiment of the present invention.

Next, a method of a fabricating fifth embodiment of the present invention is explained with reference to FIGS. 7(a) and (b). The steps shown in FIGS. 6(a)-(c) explained above are performed first. Then, protection films 47 for ion implantation of silicon nitride or the like are formed at the top of the protrusions 32, similarly to the fourth embodiment, as shown in FIG. 7(a).

Figure 7B:
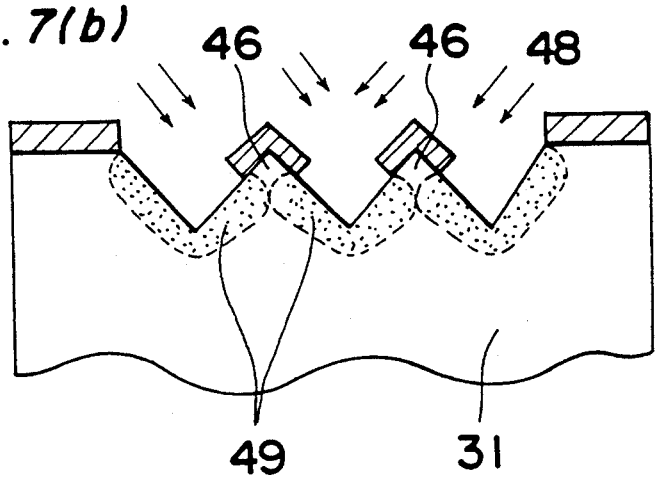

Then, by using the protection films 47 as a mask, for example boron ions 48 are implanted into the side walls 34 of the silicon substrate 31 below the surface of the substrate 31 in oblique directions at an acceleration voltage of 40 keV. Then, the annealing is performed to form a P-type impurity layer 49 at the surface 34 of the protrusions 32 except below the protection films 47, as shown in FIG. 7(b). Thus, quantum wires 46 isolated electrically from the silicon substrate 31 are formed.

It is also possible to form an oxide film layer instead of the impurity layer 49 by implanting oxygen ions to form quantum wire 46 which is isolated electrically from the silicon substrate 31. In this case, the conduction type of the substrate 31 may be either P-type or N-type.

Figure 8A:
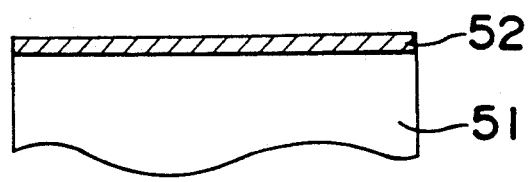
FIGS. 8(a)-(d) are schematic sectional views of a semiconductor substrate for illustrating a method of forming a quantum wire of a sixth embodiment of the present invention.
Figure 8B:
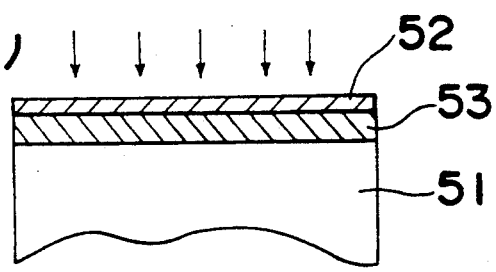
Figure 8C:
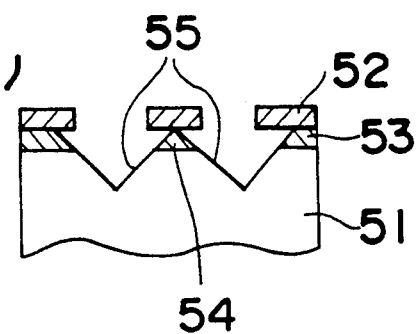
Figure 8D:
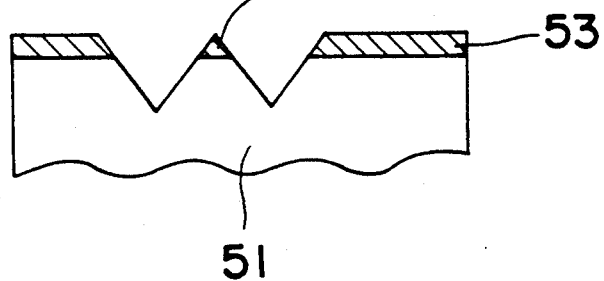

Next, a method of fabricating a sixth embodiment of the present invention is explained with reference to FIGS. 8(a)-(d). A thermal oxide film of 20 nm thickness is formed on the surface of the P-type silicon (100) substrate 51 as an etching protection film 52, as shown in FIG. 8(a). Then, arsenic ions are implanted through the etching protection films 52 at 60 kev acceleration voltage to form a thin N-type layer 53 on the surface of the substrate 51, as shown in FIG. 8(b). After the patterning of the etching protection film 52 is performed with lithography, the crystalline anisotropy etching of the silicon substrate 51 is performed by using the pattern as a mask. Thus, saw-tooth-like protrusions 54 of triangular sections are formed by adjusting the etching time, as shown in FIG. 8(c). The protrusions 54 have side planes 55 of silicon (111) planes. Next, the etching protection films 52 are removed, as shown in FIG. 8(d). Thus, an N-type quantum wire 56 which is isolated electrically from the silicon substrate 51 is formed.

In this example, the thin N-type impurity layer 53 is formed on the P-type semiconductor substrate 51. On the other hand, a P-type impurity layer may be formed on an N-type semiconductor substrate, in order to form a P-type quantum wire.

Figure 9A:
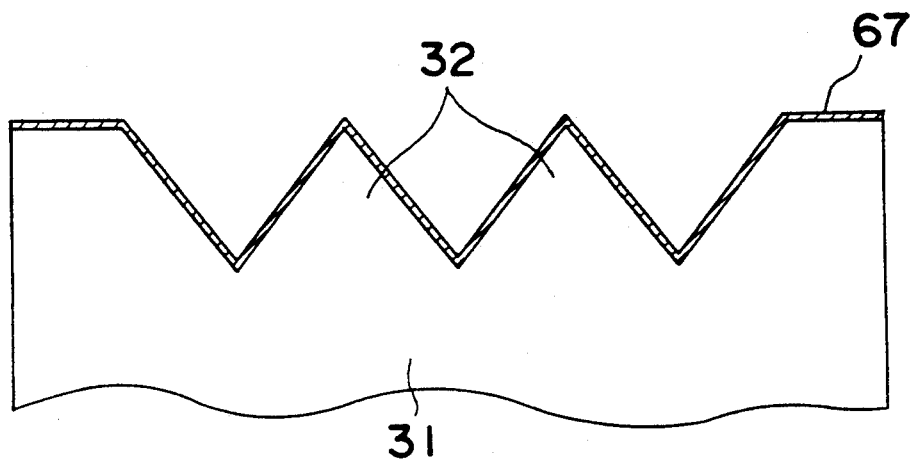
FIGS. 9(a)-(c) are schematic sectional views of a semiconductor substrate for illustrating a method of forming a quantum wire of a seventh embodiment of the present invention.
Figure 9B:
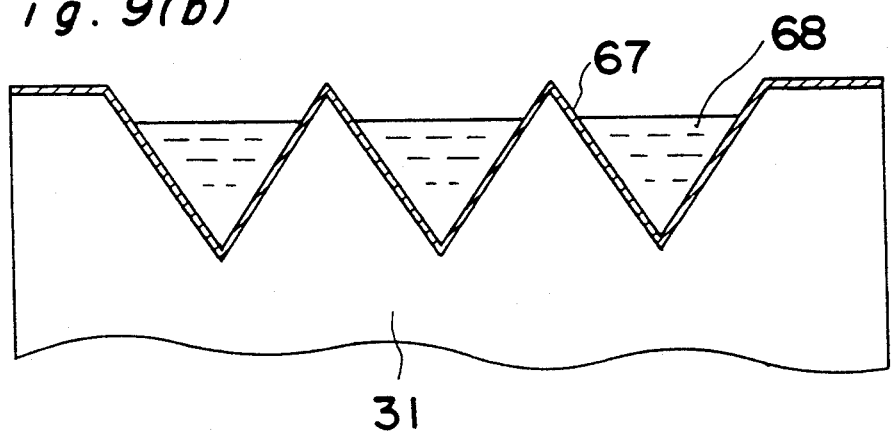

Next, a method of fabricating a seventh embodiment of the present invention is explained with reference to FIGS. 9(a)-(c). The steps shown in FIGS. 6(a)-(c) explained above are performed first. Then, an insulator film 67 of 20 nm thickness is formed on the substrate surface with thermal oxidation, as shown in FIG. 9(a).

Next, a silica glass as a passive material is spin-coated on the substrate 31, and it is transformed to a glass state by heat treatment. Then, the etch back is performed with use of dilute hydrofluoric acid until only the tops of the protrusions 32 are exposed. Next, a silicon oxide layer 68 is formed in the V-type grooves between the protrusions 32, as shown in FIG. 9(b).

Figure 9C:
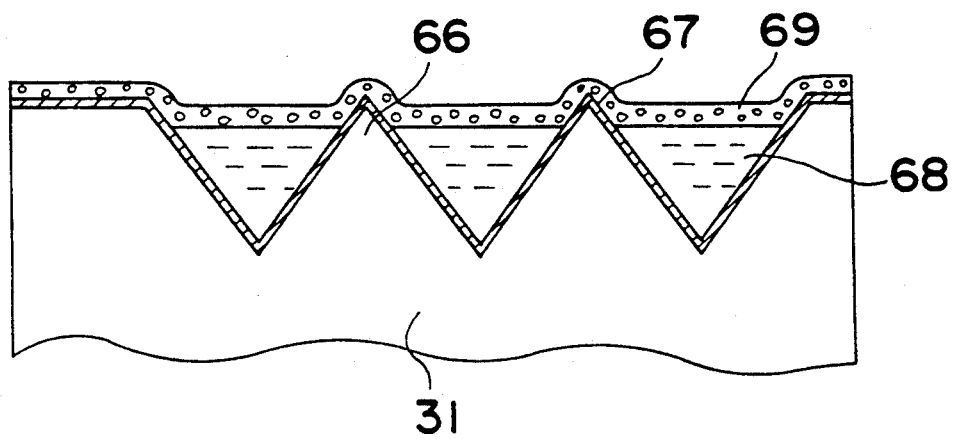

Then, a polysilicon layer of 50 nm thickness is deposited on the insulator film 67 as a gate electrode film 69, as shown in FIG. 9(c). By applying a voltage to the gate electrode film 69, quantum wires 66 are induced at the tops of the protrusions 32.

Next, a method of fabricating an eighth embodiment of the present invention is explained with reference to FIGS. 10(a)-(d). The steps shown in FIGS. 6(a)-(c) explained above are performed first. Then, an insulator film 77 of 10-30 nm thickness is formed on the substrate surface of the protrusions 32 by thermal oxidation. Next, a polysilicon film is deposited by a reduced pressure chemical vapor growth process, and impurities are doped by the diffusion of $POCl_3$ or by the ion implantation of phosphor (P) to form a polycrystalline silicon film 78 of a conduction type. Then, a titanium film 79 is deposited by sputtering. Thus, a multi-layer film is formed on the tops of the protrusions 32. Next, a resist 80 is applied to the titanium film 79, and the etch back of the resist 80 is performed to expose only the edges of the titanium film 79, as shown in FIG. 10(a).

Figure 10:
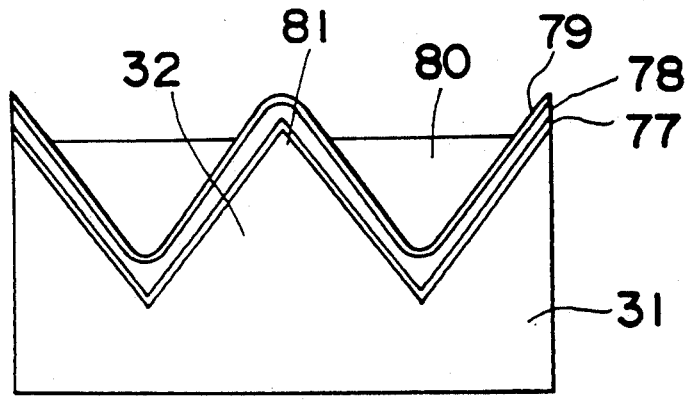
FIGS. 10(a)-(d) are schematic sectional views of a semiconductor substrate for illustrating a method of forming a quantum wire of an eighth embodiment of the present invention.
Figure 10:
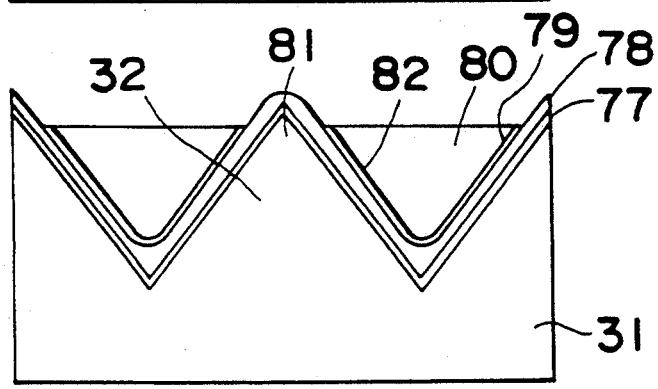
Figure 10:
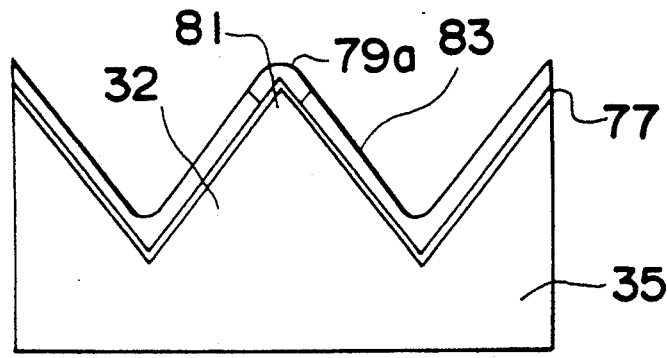
Figure 10:
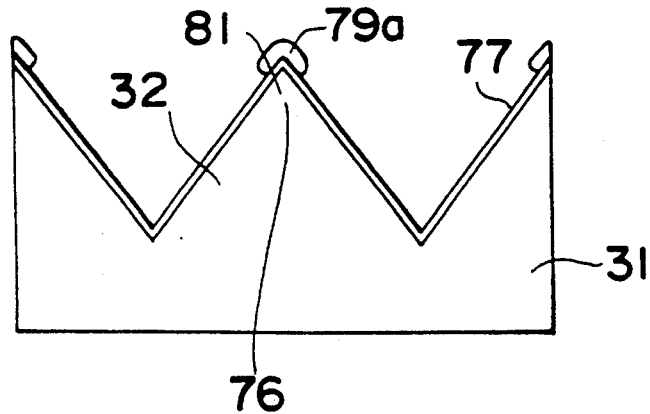

Further, the titanium film 79 exposed at the tops of the protrusions 32 is etched away, as shown in FIG. 10(b).

After removing the resist 80 with ashing, the heat treatment is performed at 600° C. or more. Thus, a titanium silicide film 83 is formed due to the silicification of the titanium film 79 with its ground or the polysilicon film 78. In this step, the polysilicon film on the edges 81 of the protrusions are remained not to be silicized as a polysilicon film 79a, as shown in FIG. 10(c). Next, the sample is processed with hydrofluoric acid. Because the titanium silicide film 83 is dissolved in hydrofluoric acid, only the polycrystalline silicon film 78a and an insulator film 77 at the edges remain. Thus, gate electrodes can be formed at the edges of the protrusions 32. By applying a voltage to the gate electrode film of polysilicon 79a, quantum wires 76 are induced at the tops of the protrusions 32.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A quantum wire structure, comprising:
   a silicon substrate comprising a protrusion forming a ridge having a triangular cross section;
   a silicon oxide layer formed on the sides of the protrusion; and
   a fine conduction line formed in the top portion of the protrusion and in contact with the silicon oxide layers;
   wherein the fine conduction line is electrically isolated from the silicon substrate.

2. A quantum wire structure, comprising:
   a silicon substrate of a conduction type, comprising a protrusion forming a ridge having a triangular cross section;
   an impurity layer formed on the sides of the protrusion, the impurity layer having an opposite conduction type than the conduction type of the silicon substrate; and
   a fine conduction line formed in the top portion of the protrusion and in contact with the impurity layer;
   wherein the fine conduction line is electrically isolated from the silicon substrate.

3. A quantum wire structure, comprising:
   a silicon substrate of a conduction type, comprising a protrusion forming a ridge having a triangular cross section;
   an insulator layer formed on the protrusion, the insulation layer covering the top of the protrusion; and
   a gate electrode layer formed on the insulator layer;
   whereby an electric voltage is applied to the gate electrode to form a fine conduction line in the top portion of the protrusion, the fine conduction line is electrically isolated from the silicon substrate.

4. A method of fabricating a quantum wire structure, comprising the steps of:
   providing a silicon substrate having (100) surface;
   forming an etching protection film and forming a pattern as a mask in the etching protection film;
   forming saw-tooth-like protrusions having (111) side planes by performing crystalline anisotropy etching with use of the mask of the etching protection film;
   removing the etching protection film;
   forming an oxidization protection film covering the top portion of the protrusion; and
   oxidizing the side planes of the saw-tooth-like protrusions so as to form an unoxidized area in the top portion of each protrusion under the oxidization protection film;
   whereby a fine conduction line is formed in the unoxidized region of each protrusion, each fine conduction line is electrically isolated from the silicon substrate.

5. A method of fabricating a quantum wire structure, comprising the steps of:
   providing a silicon substrate having (100) surface;
   forming an etching protection film and forming a pattern as a mask in the etching protection film;
   forming saw-tooth-like protrusions having (111) side planes by performing crystalline anisotropy etching with use of the mask of the etching protection film;
   removing the etching protection film;
   forming an ion implantation protection film covering the top portion of the protrusions;
   implanting oxygen ions into the portions of the side planes of the silicon substrate not protected by the ion implantation protection film; and
   forming an oxidation film in the ion implanted side planes by heat treatment;
   whereby the top portion of each protrusion under the ion implantation film remains unoxidized, and forms a fine conduction line which is electrically isolated from the silicon substrate.

6. A method of fabricating a quantum wire structure, comprising the steps of:
   providing a silicon substrate having (100) surface;
   forming an etching protection film and forming a pattern as a mask in the etching protection film;
   forming saw-tooth-like protrusions having (111) side planes by performing crystalline anisotropy etching with use of the mask of the etching protection film;
   removing the etching protection film;
   forming an ion implantation protection film covering the top of the protrusions; and
   implanting impurity ions into the portions of the silicon substrate not protected by the ion implantation protection film;
   whereby the top portion of each protrusion under the ion implantation film remains pure silicon, and forms a fine conduction line which is electrically isolated from the silicon substrate.

7. A method of fabrication a quantum wire structure, comprising the steps of:
   providing a silicon substrate having (100) surface;
   forming an etching protection film and forming a pattern as a mask in the etching protection film;
   implanting impurity ions through the etching protection film into the silicon substrate to form a shallow impurity layer having a polarity opposite that of the silicon substrate;
   forming saw-tooth-like protrusions having (111) side planes by performing crystalline anisotropy etching with use of the mask of the etching protection film, wherein the top portions of the saw-tooth-like protrusions are formed by the impurity layer; and
   removing the etching protection film;
   whereby the top portion of each saw-tooth-like protrusion formed by the impurity layer forms a fine conduction line which is electrically isolated from the silicon substrate.

8. A method of fabricating a quantum wire structure, comprising the steps of:
   providing a silicon substrate having (100) surface;
   forming an etching protection film and forming a pattern as a mask in the etching protection film;
   forming saw-tooth-like protrusions having (111) side planes by performing crystalline anisotropy etching with use of the mask of the etching protection film;
   removing the etching protection film;
   forming an insulator film on the surface of the substrate;
   embedding a silica glass on the surface of the insulator film except on the top portion of the saw-tooth-like protrusions; and
   forming a gate electrode film on the top portion of the saw-tooth-like protrusions;

whereby a fine conduction line is formed in the top portion of each protrusions when a voltage is applied to the gate electrode film.

9. A method of fabricating a quantum wire structure, comprising the steps of:

providing a silicon substrate having (100) surface;

forming an etching protection film and forming a pattern as a mask in the etching protection film;

forming saw-tooth-like protrusions having (111) side planes by performing crystalline anisotropy etching with use of the mask of the etching protection film;

removing the etching protection film;

layering an insulator film, a conductive polycrystalline silicon film and a metallic film successively on the surface of the semiconductor substrate;

embedding a resist on the surface of the metallic layer except on the top portion of the saw-tooth-like protrusions;

removing the metallic film covering the top portion of the saw-tooth-like protrusions and removing the resist;

forming a metal silicide film by heat treatment to react the metallic film with the polycrystalline silicon; and removing the metallic silicide film selectively so that the conductive polycrystalline silicon film forms a gate electrode located on the top portion of the saw-tooth-like protrusions;

whereby a fine conduction line is formed in the top portion of each protrusion when a voltage is applied to the gate electrode film.

* * * * *